(12) United States Patent
Han

(10) Patent No.: US 9,343,518 B2
(45) Date of Patent: May 17, 2016

(54) ORGANIC LIGHT-EMITTING DISPLAY APPARATUS INCLUDING DISCONTINUOUS INSULATING LAYER

(71) Applicant: SAMSUNG DISPLAY CO., LTD., Yongin, Gyeonggi-Do (KR)

(72) Inventor: Byung-Uk Han, Yongin (KR)

(73) Assignee: SAMSUNG DISPLAY CO., LTD., Yongin, Gyeonggi-do (KR)

( * ) Notice: Subject to any disclaimer, the term of this patent is extended or adjusted under 35 U.S.C. 154(b) by 0 days.

(21) Appl. No.: 14/530,966

(22) Filed: Nov. 3, 2014

(65) Prior Publication Data
US 2015/0357396 A1   Dec. 10, 2015

(30) Foreign Application Priority Data
Jun. 9, 2014  (KR) .......................... 10-2014-0069569

(51) Int. Cl.
*H01L 27/14*  (2006.01)
*H01L 27/32*  (2006.01)

(52) U.S. Cl.
CPC ............ *H01L 27/3276* (2013.01); *H01L 27/32* (2013.01); *H01L 27/3246* (2013.01); *H01L 27/3262* (2013.01)

(58) Field of Classification Search
CPC ... H01L 27/3276; H01L 33/56; H01L 29/786; H01L 51/5237; H01L 27/3246; H01L 27/3248; H01L 51/56; H01L 51/5253; H01L 27/3244; H05B 33/04; H05B 33/10
See application file for complete search history.

(56) References Cited

U.S. PATENT DOCUMENTS

| | | | | |
|---|---|---|---|---|
| 7,112,115 | B1 * | 9/2006 | Yamazaki | ............ H01L 51/5237 313/512 |
| 8,164,726 | B2 * | 4/2012 | Egi | ........................ G02B 1/118 349/137 |
| 2002/0047514 | A1 * | 4/2002 | Sakurai | ............... H01L 27/3246 313/503 |
| 2002/0158568 | A1 * | 10/2002 | Satake | .................. H01L 27/322 313/493 |
| 2005/0184927 | A1 * | 8/2005 | Kwak | .................. H01L 51/5237 345/45 |
| 2006/0255719 | A1 * | 11/2006 | Oikawa | ............... H01L 51/5206 313/503 |
| 2008/0230767 | A1 * | 9/2008 | Jung | ........................ H01L 27/12 257/40 |
| 2009/0026932 | A1 * | 1/2009 | Kwak | .................. H01L 27/3276 313/504 |
| 2012/0319123 | A1 | 12/2012 | Han et al. | |
| 2013/0134401 | A1 | 5/2013 | Murakami et al. | |
| 2013/0299790 | A1 | 11/2013 | Kang et al. | |
| 2015/0221707 | A1 | 8/2015 | Go | |

FOREIGN PATENT DOCUMENTS

| JP | 2006-113568 A | 4/2006 |
|---|---|---|
| KR | 10-2012-0136697 A | 12/2012 |
| KR | 10-2012-0138168 A | 12/2012 |
| KR | 10-2013-0125294 A | 11/2013 |
| TW | 201532334 A | 8/2015 |

* cited by examiner

*Primary Examiner* — Bilkis Jahan
(74) *Attorney, Agent, or Firm* — Lee & Morse, P.C.

(57) ABSTRACT

An organic light-emitting display apparatus includes a substrate including a display area, a peripheral area surrounding the display area, and an outermost area surrounding the peripheral area, a first insulating layer on the substrate across the display area, the peripheral area, and the outermost area, the first insulating layer being discontinuous in the peripheral area, a second insulating layer on the substrate across the display area and the peripheral area, is the second insulating layer being positioned on the first insulating layer in the display area and on a layer under the first insulating layer in a discontinuous portion of the first insulating layer in the peripheral area, and a pixel electrode on the second insulating layer in the display area.

10 Claims, 7 Drawing Sheets

Comparative Example

ORGANIC LIGHT-EMITTING DISPLAY APPARATUS INCLUDING DISCONTINUOUS INSULATING LAYER

CROSS-REFERENCE TO RELATED APPLICATION

Korean Patent Application No. 10-2014-0069569, filed on Jun. 9, 2014, in the Korean Intellectual Property Office, and entitled: "Organic Light-Emitting Display Apparatus," is incorporated by reference herein in its entirety.

BACKGROUND

1. Field

One or more embodiments relate to an organic light-emitting display apparatus.

2. Description of the Related Art

Generally, an organic light-emitting display apparatus includes organic light-emitting devices, each including a pixel electrode, an opposite electrode, and an intermediate layer that is interposed between the pixel electrode and the opposite electrode and includes a light-emitting layer. In the organic light-emitting display apparatus, pixel electrodes are disposed spaced apart from each other and pixels are defined by a pixel-defining layer.

SUMMARY

Embodiments are directed to an organic light-emitting display apparatus including a substrate comprising a display area, a peripheral area surrounding the display area, and an outermost area surrounding the peripheral area, a first insulating layer on the substrate across the display area, the peripheral area, and the outermost area, the first insulating layer being discontinuous in the peripheral area, a second insulating layer on the substrate across the display area and the peripheral area, the second insulating layer being positioned on the first insulating layer in the display area and on a layer under the first insulating layer in a discontinuous portion of the first insulating layer in the peripheral area, and a pixel electrode on the second insulating layer in the display area.

The organic light-emitting display apparatus may further include a buffer layer between the substrate and the first insulating layer across the display area, the peripheral area, and the outermost area. The second insulating layer may be on the buffer layer in the discontinuous portion of the first insulating layer.

The second insulating layer may contact the buffer layer in the discontinuous portion of the first insulating layer.

The first insulating layer may include a gate insulating layer, and an interlayer insulating layer on the gate insulating layer.

The organic light-emitting display apparatus may further include an additional insulating layer between the buffer layer and the first insulating layer, across the display area, the peripheral area, and the outermost area. The second insulating layer may be positioned on the additional insulating layer at the discontinuous portion of the first insulating layer.

The additional insulating layer may be a gate insulating layer. The first insulating layer may be an interlayer insulating layer.

The organic light-emitting display apparatus may further include a sealing portion on the first insulating layer in the outermost area. The sealing portion may bond the substrate and an encapsulation substrate together.

The organic light-emitting display apparatus may further include a conductive layer between the first insulating layer and the sealing portion in the outermost area.

The conductive layer may include at least one of a first conductive layer and a second conductive layer. The first conductive layer may be formed of a same material as a source electrode and a drain electrode in the display area, and the second conductive layer may be formed of a same material as the pixel electrode in the display area.

In the peripheral area, an end of the second insulating layer in a direction toward the outermost area may be closer to a center portion of the substrate than an end of the discontinuous portion of the first insulating layer in the direction toward the outermost area.

The organic light-emitting display apparatus may further include an electrode power supply line located in the peripheral area. The electrode power supply line may be positioned in the discontinuous portion of the first insulating layer in the peripheral area. An end of the second insulating layer in a direction toward the outermost area may be positioned on the electrode power supply line.

BRIEF DESCRIPTION OF THE DRAWINGS

Features will become apparent to those of skill in the art by describing in detail exemplary embodiments with reference to the attached drawings in which.

DETAILED DESCRIPTION

Figure 1:
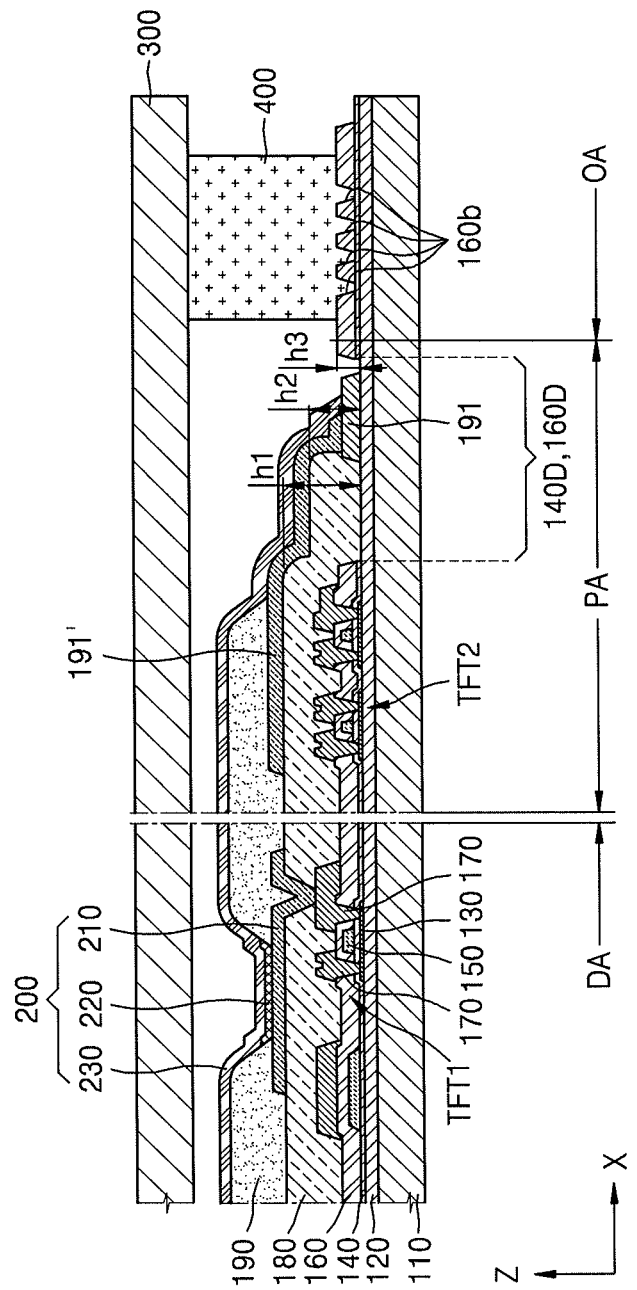
FIG. 1 illustrates a cross-sectional view of an organic light-emitting display apparatus according to an embodiment.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey exemplary implementations to those skilled in the art.

In the drawing figures, the dimensions of layers and regions may be exaggerated for clarity of illustration. It will also be understood that when a layer or element is referred to as being "on" another layer or substrate, it can be directly on the other layer or substrate, or intervening layers may also be present. Further, it will be understood that when a layer is referred to as being "under" another layer, it can be directly under, and one or more intervening layers may also be present. In addition, it will also be understood that when a layer is referred to as being "between" two layers, it can be the only layer between the two layers, or one or more intervening layers may also be present. Like reference numerals refer to like elements throughout.

As used herein, the term "and/or" includes any and all combinations of one or more of the associated listed items. Expressions such as "at least one of," when preceding a list of elements, modify the entire list of elements and do not modify the individual elements of the list.

In the following examples, the x-axis, the y-axis and the z-axis are not limited to three axes of the rectangular coordinate system, and may be interpreted in a broader sense. For example, the x-axis, the y-axis, and the z-axis may be perpendicular to one another, or may represent different directions that are not perpendicular to one another.

FIG. 1 illustrates a cross-sectional view of an organic light-emitting display apparatus according to an embodiment. As illustrated in FIG. 1, an organic light-emitting display apparatus according to the current embodiment may include a substrate 110 that includes a display area DA, a peripheral area PA surrounding the display area DA, and an outermost area OA surrounding the peripheral area PA. The substrate 110 may be formed of various materials such as a glass material, a metallic material, or a plastic material.

In the display area DA of the substrate 110, a plurality of thin film transistors TFT1 may be disposed and organic light-emitting devices 200 electrically connected to the plurality of thin film transistors TFT1 may also be disposed. When the organic light-emitting devices 200 are electrically connected to the plurality of thin film transistors TFT1, a plurality of pixel electrodes 210 may be electrically connected to the plurality of thin film transistors TFT1. A thin film transistor TFT2 may also be disposed in the peripheral area PA of the substrate 110. The thin film transistor TFT2 may be a part of a circuit unit for controlling an electric signal applied to, for example, the display area DA. The outermost area OA of the substrate 110 may be understood to be an area in which a sealing portion 400 for bonding the substrate 110 and an opposite substrate 300 together is located.

The thin film transistor TFT1 or TFT2 may include a semiconductor layer 130 including amorphous silicon, polycrystalline silicon, or an organic semiconductor material, a gate electrode 150, and a source electrode/drain electrode 170. To planarize a surface of the substrate 110 or to prevent impurities from penetrating into the semiconductor layer 130, a buffer layer 120 formed of silicon oxide or silicon nitride is disposed on the substrate 110 and the semiconductor layer 130 may be located on the buffer layer 120.

The gate electrode 150 may be disposed on the semiconductor layer 130. The source electrode/drain electrode 170 may electrically communicate according to a signal applied to the gate electrode 150. The gate electrode 150 may be formed as a single layer or multiple layers made of one or more of, for example, aluminum (Al), platinum (Pt), palladium (Pd), silver (Ag), magnesium (Mg), gold (Au), nickel (Ni), neodymium (Nd), iridium (Ir), chromium (Cr), lithium (Li), calcium (Ca), molybdenum (Mo), titanium (Ti), tungsten (W), or copper (Cu), considering adhesion with an adjacent layer, a surface evenness of a deposited layer, and processability. To secure insulation between the semiconductor layer 130 and the gate electrode 150, a gate insulating layer 140 formed of silicon oxide and/or silicon nitride may be interposed between the semiconductor layer 130 and the gate electrode 150.

An interlayer insulating layer 160 may be disposed on the gate electrode 150. The interlayer insulating layer 160 may be formed as a single layer or as multiple layers made of silicon oxide or silicon nitride.

The source electrode/drain electrode 170 may be disposed on the interlayer insulating layer 160. The source electrode/drain electrode 170 may be electrically connected to the semiconductor layer 130 through a contact hole formed in the interlayer insulating layer 160 and the gate insulating layer 140. Considering conductivity, the source electrode/drain electrode 170 may be formed as a single layer or as multiple layers made of one or more of, for example, aluminum (Al), platinum (Pt), palladium (Pd), silver (Ag), magnesium (Mg), gold (Au), nickel (Ni), neodymium (Nd), iridium (Ir), chromium (Cr), lithium (Li), calcium (Ca), molybdenum (Mo), titanium (Ti), tungsten (W), or copper (Cu).

To protect the thin film transistor TFT1 having such a structure, a protection layer (not illustrated) may be disposed to cover the thin film transistor TFT1. The protection layer may be formed of an inorganic material such as silicon nitride or silicon oxy nitride. The protection layer may be implemented in various ways. For example, the protection layer may have a single-layer structure or a multi-layer structure.

A planarization layer 180 may be disposed to cover the thin film transistor TFT1 if the protection layer does not exist, and to cover the protection layer if the protection layer exists. For example, if an organic light-emitting device 200 is disposed on the thin film transistor TFT1 as illustrated, the planarization layer 180 may have a planar or even top surface on which the pixel electrode 210 is formed. The planarization layer 180 may be formed of, for example, an acrylic organic material or benzocyclobutene (BCB). While the planarization layer 180 is illustrated as a single layer in FIG. 1, the protection layer 180 may be implemented in various ways. For example, the protection layer 180 may be a multi-layer structure.

According to some implementations, the protection layer may exist alone without the planarization layer 180. According to some implementations, the protection layer may be omitted or the planarization layer 180 may be omitted, or the protection layer and the planarization layer 180 may be integrated into one piece. The following description is of a case of where the planarization layer 180 exists alone.

The organic light-emitting device 200 may be disposed on the planarization layer 180, in the display area DA of the substrate 110. The organic light-emitting device may include the pixel electrode 210, the opposite electrode 230, and the intermediate layer 220 interposed therebetween to form a light-emitting layer.

An opening in the planarization layer 180 may expose at least one of the source electrode/drain electrode 170 of the thin film transistor TFT1. The pixel electrode 210 may be disposed on the planarization layer 180 to be electrically connected with the thin film transistor TFT1 by contacting any one of the source electrode/drain electrode 170 through the opening. The pixel electrode 210 may be formed as a (semi-) transparent electrode or a reflective electrode. When formed as the (semi-) transparent electrode, the pixel electrode 210 may be formed of, for example, ITO, IZO, ZnO, $In_2O_3$, IGO, or AZO. When formed as the reflective electrode, the pixel electrode 210 may include a reflective layer formed of Ag, Mg, Al, Pt, Pd, Au, Ni, Nd, Ir, Cr, or a compound thereof, and a layer formed of ITO, IZO, ZnO, $In_2O_3$, IGO, or AZO. The pixel may be formed of various materials and may be changed in various ways such that the pixel electrode 210 may have a single-layer structure or a multi-layer structure.

The intermediate layer 220 of the organic light-emitting device 200 may include a low-molecular or high-molecular material. If the intermediate layer 220 includes a low-molecular material, the intermediate layer 220 may include a hole injection layer (HIL), a hole transport layer (HTL), an emission layer (EML), an electron transport layer (ETL), an electron injection layer (EIL), or the like. When the intermediate layer 220 includes a high-molecular material, the intermediate layer 220 may include the HTL and the EML. However, in other implementations, the intermediate layer 220 may have various other structures.

The opposite electrode 230 may be disposed on the display area DA to cover the display area DA. The opposite electrode 230 may be formed as one piece in the plurality of organic light-emitting devices 200 to correspond to the plurality of pixel electrodes 210.

The opposite electrode 230 may be disposed across the display area DA and the peripheral area PA. The opposite electrode 230 may be formed as a (semi-)transparent electrode or as a reflective electrode. When the opposite electrode 230 is formed as the (semi-)transparent electrode, the opposite electrode 230 may include a layer formed of metal having a small work function, for example, Li, Ca, LiF/Ca, LiF/Al, Al, Ag, Mg, or a compound thereof and a (semi-) transparent conductive layer such as ITO, IZO, ZnO, or $In_2O_3$. When the opposite electrode 230 is formed as a reflective electrode, the opposite electrode 230 may include a layer formed of Li, Ca, LiF/Ca, LiF/Al, Al, Ag, Mg, or a compound thereof. However, various changes may be possible in the structure and material of the opposite electrode.

The pixel electrode 210 may be partially covered with the pixel-defining layer 190. The pixel-defining layer 190 may be disposed on the planarization layer 180 in such a way as to expose at least a central portion of the pixel electrode 210. The pixel-defining layer 190 may be formed of various materials, for example, an organic material such as polyimide.

The gate insulating layer 140 and the inter-layer insulating layer 160 may be collectively referred to as first insulating layers, and the planarization layer 180 may be referred to as a second insulating layer. The first insulating layers 140 and 160 may be disposed across the display area DA, the peripheral area PA, and the outermost area OA of the substrate 110 as illustrated in FIG. 1 in such a way to be discontinuous in the peripheral area PA. In FIG. 1, the first insulating layers, the gate insulating layer 140 and the interlayer insulating layer 160 may be discontinuous in discontinuous portions 140D and 160D of the peripheral area PA. Thus, the planarization layer 180, which is the second insulating layer, may be disposed across the display area DA and the peripheral area PA, in such a way as to be positioned on the first insulating layer in the display area DA and on the buffer layer 120 that is under the first insulating layer in the discontinuous portions 140D and 160D of the first insulating layers in the peripheral area PA. In this case, the planarization layer 180, which is the second insulating layer, may contact the buffer layer 120 in the discontinuous portions 140D and 160D of the first insulating layers in the peripheral area PA.

An electrode power supply line 191 and a connection line 191' contacting the electrode power supply line 191 may be disposed in the peripheral area PA, which is external with respect to the display area DA on the substrate 110. The opposite electrode 230 may be disposed across the display area DA and the peripheral area PA of the substrate 110 to contact an electrode power supply line 191 and/or a connection line 191' of the peripheral area PA. The opposite electrode 230 may receive electrode power, for example, an electric signal from the electrode power supply line 191.

The electrode power supply line 191 may be formed of the same material as that of the source electrode/drain electrode 170 of the thin film transistors TFT1 and TFT2 simultaneously with formation of the source electrode/drain electrode 170 as illustrated in FIG. 1. The electrode power supply line 191 may be disposed in the discontinuous portions 140D and 160D of the first insulating layers in the peripheral area PA as illustrated in FIG. 1. In this case, the electrode power supply line 191 may be disposed on the buffer layer 120 that is under the first insulating layers.

The planarization layer 180, which is the second insulating layer, may be disposed across the display area DA and the peripheral area PA, such that an end of the planarization layer 180 in a direction to the outermost area OA is disposed within the peripheral area PA. In FIG. 1, the end of the planarization layer 180 in a direction toward the outermost area OA may contact the electrode power supply line 191. The end of the planarization layer 180 in a direction toward the outermost area OA may be disposed on the electrode power supply line 191. The end of the planarization layer 180 in a direction to the outermost area OA may be disposed within the discontinuous portions 140D and 160D of the first insulating layers in the peripheral area PA. In the peripheral area PA, the end of the planarization layer 180 in a direction toward the outermost area OA may be relatively closer to a center portion of the substrate 110 than the end of the discontinuous portions 140D and 160D of the first insulating layers in a direction toward the outermost area OA.

The opposite substrate 300 may be disposed to face the substrate 110 such that the electrode power supply line 191 and the organic light-emitting device 200 are interposed between the opposite substrate 300 and the substrate 110. The opposite substrate 300 and the substrate 110 may be bonded by the sealing portion 400. The interlayer insulating layer 160 on the substrate 110 may have a hole 160b in the outermost area OA, and the sealing portion 400 may fill the hole 160b. A bonding force between the sealing portion 400 and the substrate 110 may be improved.

In such an organic light-emitting display apparatus according to the current embodiment, extreme changes in heights of insulating layers, except for the pixel-defining layer 190, may be effectively reduced in the display area DA, the peripheral area PA, and the outermost area OA. In a direction from the display area DA to the outermost area OA through the peripheral area PA, extreme changes in the heights of the insulating layers except for the pixel-defining layer 190 may be effectively reduced.

In the display area DA, a height from the top surface of the buffer layer 120 to the top surface of the insulating layer except for the pixel-defining layer, for example from the top surface of the buffer layer 120 to the top surface of the second insulating layer on the first insulating layer, that is, the top surface of the planarization layer 180, may be represented as a height h1. In the outermost area OA, a height from the top surface of the buffer layer 120 to the top surface of the insulating layer, for example, from the top surface of the buffer layer 120 to the top surface of the first insulating layer, that is, the top surface of the interlayer insulating layer 160 may be represented as a height h3. In the peripheral area PA, near the display area DA, a height from the top surface of the buffer layer 120 to the top surface of the insulating layer except for the pixel-defining layer 190 is equal to the height h1 from the top surface of the buffer layer 120 to the top surface of the second insulating layer on the first insulating layer, that is, the top surface of the planarization layer 180. In the discontinuous portions 140D and 160D of the first insulating layers in the peripheral area PA, a height from the top surface of the buffer layer 120 to the top surface of the insulating layer, for example from the top surface of the buffer layer 120 to the top surface of the second insulating layer, that is, the top surface of the planarization layer 180 may be represented as height h2.

In the discontinuous portions 140D and 160D of the first insulating layers in the peripheral area PA, the gate insulating layer 140 and the interlayer insulating layer 160, which are the first insulating layers, are not present under the planarization layer 180, such that the height h2 is lower than the height h1 and is higher than the height h3. Thus, in a direction from the display area DA to the outermost area OA through the peripheral area PA, a height change may occur from the height h1 through the height h2 to the height h3, instead of an extreme height change from the height h1 directly to the height h3. As such, an extreme height change may be reduced or avoided, thereby remarkably reducing a failure rate in the formation of the pixel-defining layer 190, as will be described below.

Figure 2:
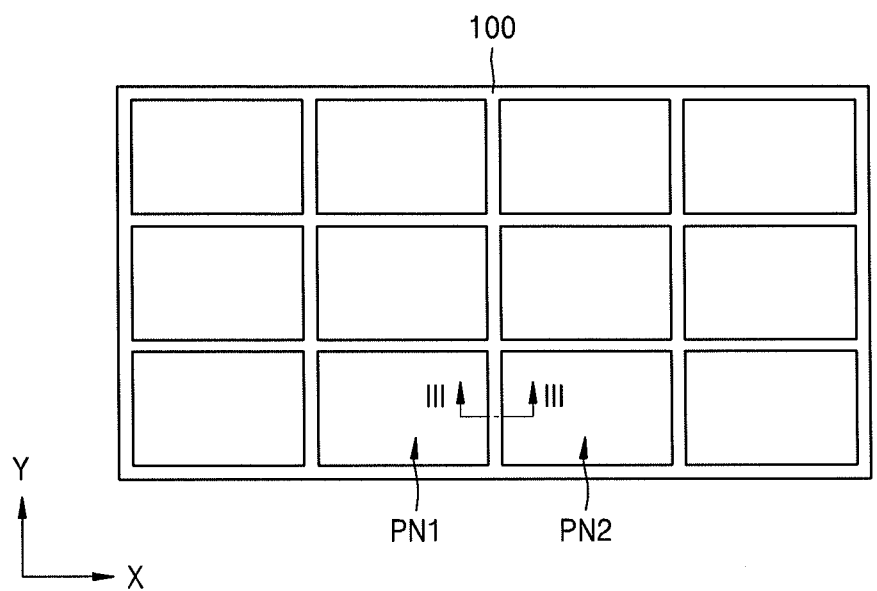
FIG. 2 illustrates a plan view of a process of manufacturing an organic light-emitting display apparatus of FIG. 1.
Figure 3:
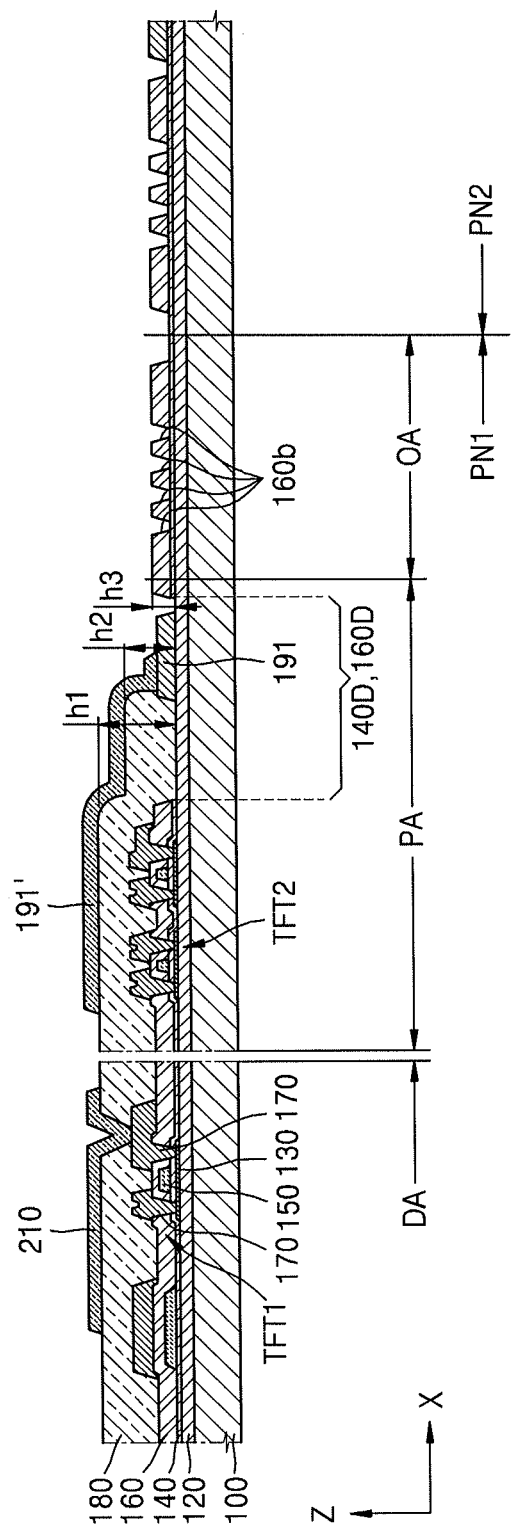
FIG. 3 illustrates a cross-sectional view taken along a line III-III of FIG. 2.

FIG. 2 illustrates a plan view of a process of manufacturing an organic light-emitting display apparatus of FIG. 1, and FIG. 3 illustrates a cross-sectional view taken along a line III-III of FIG. 2. FIGS. 2 and 3 schematically illustrate a process of manufacturing an organic light-emitting display apparatus according to an embodiment.

Referring to FIG. 2, a plurality of display units may be formed on a mother substrate (or glass) 100. Although one display unit may be formed on one board to manufacture one organic light-emitting display apparatus, in other implementations, a plurality of display units may be formed at the same time on one mother substrate 100 and the mother substrate 100 may be cut to form a plurality of organic light-emitting display apparatuses at the same time, as illustrated in FIG. 2.

FIG. 3 illustrates a cross-sectional view taken along a line III-III of FIG. 2. FIG. 3 illustrates a cross-sectional view illustrating a portion of an edge of an organic light-emitting display apparatus PN1 and a portion of an edge of an organic light-emitting display apparatus PN2. A state illustrated in FIG. 3 is a state after the pixel electrode 210 is formed and before a pixel-defining layer (190 of FIG. 1) is formed. The organic light-emitting display apparatus PN1 of FIG. 3 may be understood as a part of the organic light-emitting display apparatus according to the current embodiment.

The pixel-defining layer 190 having an opening for exposing a central portion of the pixel electrode 210 may be formed after the pixel electrode 210 is formed. To this end, an organic material, such as polyimide, as a material for forming the pixel-defining layer 190 may be coated onto the planarization layer 180 and the pixel electrode 210 in a form illustrated in FIG. 3. A nozzle for injecting the material for forming the pixel-defining layer 190, may move, for example, in a direction from left to right (for example, in a +x direction) in FIG. 3 and such that the material for forming the pixel-defining layer 190 may be coated onto the planarization layer 180 and the pixel electrode 210.

If a structure onto which the material for forming the pixel-defining layer 190 is coated has a large step difference, a failure could occur in which the material for forming the pixel-defining layer 190 is not coated in a uniform thickness. In addition, when a plurality of organic light-emitting display apparatuses are manufactured at the same time by using one large-area mother substrate 100, the material for forming the pixel-defining layer 190 may not be uniformly spread from one organic light-emitting display apparatus onto another organic light-emitting display apparatus.

Figure 4:
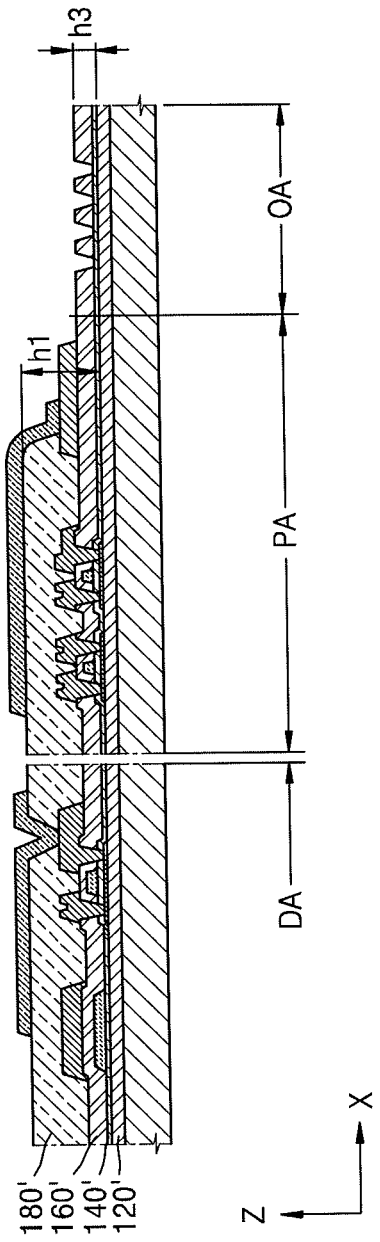
FIG. 4 illustrates a cross-sectional view of a part of an organic light-emitting display apparatus based on a comparison example.

As illustrated in FIG. 4, which is a cross-sectional view schematically illustrating a portion under the pixel-defining layer 190, in a comparative organic light-emitting display apparatus, a gate insulating layer 140' and an interlayer insulating layer 160', which are first insulating layers, do not have discontinuous portions in the peripheral area PA and are continuous on a buffer layer 120' as one body toward the outermost area OA. Thus, in a direction from the display area DA toward the outermost area OA through the peripheral area PA, a height from the top surface of the buffer layer 120' to the top surface of the insulating layer of the topmost portion changes severely from the height h1 to the height h3. In the comparative organic light-emitting display apparatus, when the material for forming a pixel-defining layer is coated to form the pixel-defining layer, issues of discontinuity could arise.

However, in the organic light-emitting display apparatus according to the current embodiment, in the direction from the display area DA to the outermost area OA through the peripheral area PA, the height from the top surface of the buffer layer 120 to the top surface of the insulating layer of the topmost portion changes from the height h1 to the height h2 and then to the height h3, without changing from the height h1 directly to the height h3. As such, a severe change in height may be avoided, and a failure rate in the formation of the pixel-defining layer 190 may be remarkably reduced.

Figure 5:
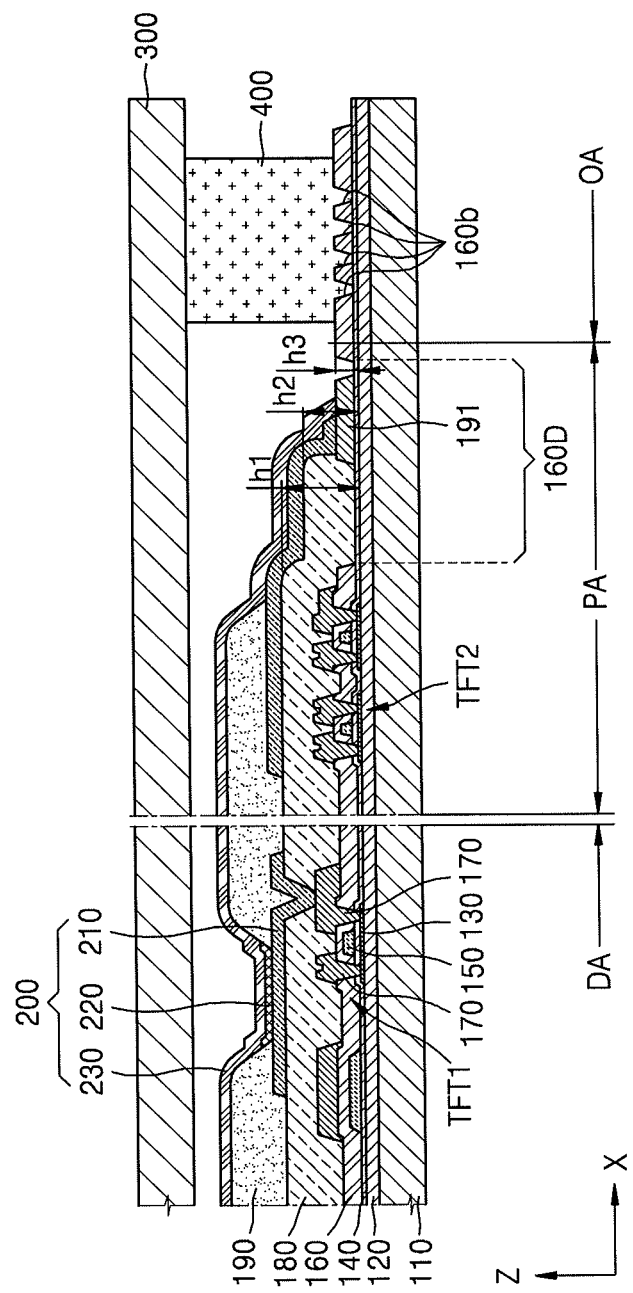
FIG. 5 illustrates a cross-sectional view of an organic light-emitting display apparatus according to another embodiment.

FIG. 5 illustrates a cross-sectional view of an organic light-emitting display apparatus according to another embodiment. The organic light-emitting display apparatus according to the current embodiment is different from the organic light-emitting display apparatus according to the previous embodiment described with reference to FIG. 1 in terms of a shape of the gate insulating layer 140. In the organic light-emitting display apparatus according to the current embodiment, the gate insulating layer 140 may be formed as one body on the buffer layer 120 across the display area DA, the peripheral area PA, and the outermost area OA. The interlayer insulating layer 160 may have the discontinuous portion 160D in the peripheral area PA.

In the organic light-emitting display apparatus according to the current embodiment, the interlayer insulating layer 160 may be considered as the first insulating layer having the discontinuous portion 160D. The planarization layer 180 may be positioned on the first insulating layer. The planarization layer 180 may be considered as the second insulating layer that contacts a layer under the first insulating layer in the discontinuous portion 160D of the first insulating layer. The gate insulating layer 140 may be considered as an additional insulating layer that is under the first insulating layer.

As in the organic light-emitting display apparatus according to the previous embodiment described with reference to FIG. 1, in the discontinuous portion 160D of the first insulating layer in the peripheral area PA of the organic light-emitting display apparatus according to the current embodiment, the height from the top surface of the buffer layer 120 to the top surface of the insulating layer is equal to the height h2 from the top surface of the buffer layer 120 to the top surface of the second insulating layer, that is, the top surface of the planarization layer 180. However, in the organic light-emitting display apparatus according to the current embodiment, the gate insulating layer 140 does not have a discontinuous portion, such that when compared to the organic light-emitting display apparatus according to the previous embodiment described with reference to FIG. 1, the height h2 is increased by the thickness of the gate insulating layer 140.

The interlayer insulating layer 160 has the discontinuous portion 160D in the peripheral area PA, such that in the organic light-emitting display apparatus according to the current embodiment, in the direction from the display area DA toward the outermost area OA through the peripheral area PA, a severe height change does not occur from the height h1 to the height h3. Instead, a height change occurs from the height h1 to the height h2 and then to the height h3. As such, by avoiding a severe height change, a failure rate may be remarkably reduced in the formation of the pixel-defining layer 190.

Figure 6:
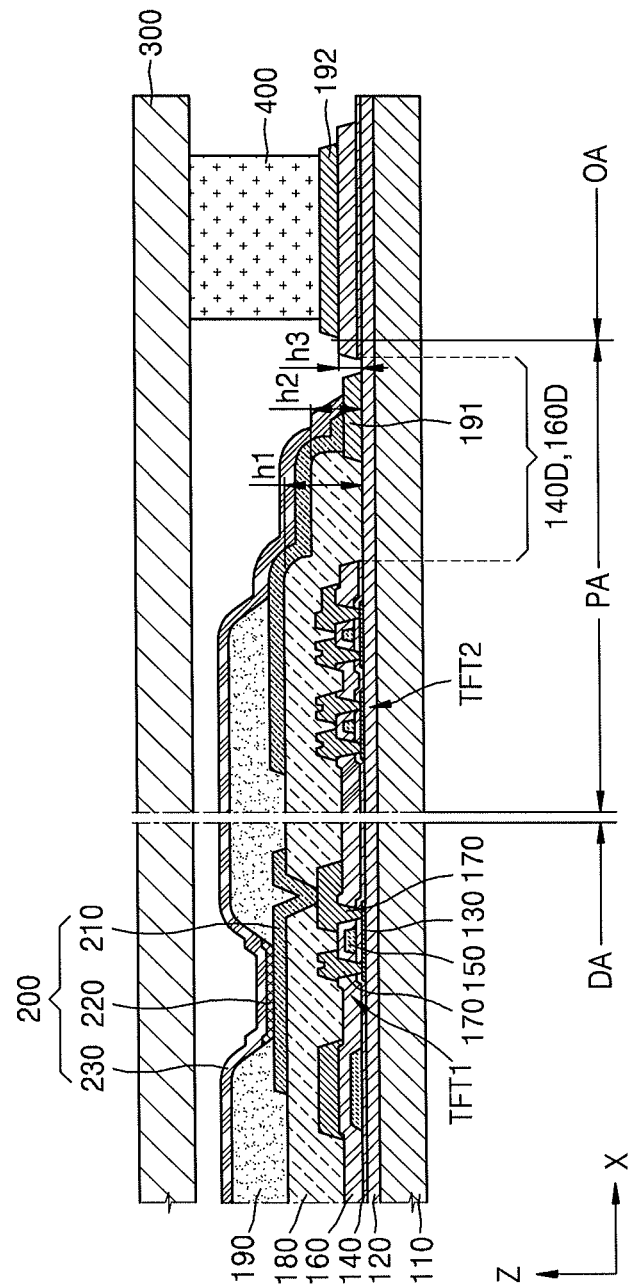
FIG. 6 illustrates a cross-sectional view of an organic light-emitting display apparatus according to another embodiment.

FIG. 6 illustrates a cross-sectional view of an organic light-emitting display apparatus according to another embodiment. The organic light-emitting display apparatus according to the current embodiment is different from the previous embodiment described with reference to FIG. 1 in that in the outermost area OA, a conductive layer 192 may be further provided between the first insulating layer and the sealing portion 400, for example, between the interlayer insulating layer 160 and the sealing portion 400.

According to the current embodiment, the height h3 in the outermost area OA is maintained. However, when the material for forming the pixel-defining layer is coated, the material may be coated onto the conductive layer 192 in the outermost area OA. Thus, when the material for forming the pixel-defining layer is coated, in the direction from the display area DA toward the outermost area OA through the peripheral area PA, the height may be understood as changing from the height h1 to the height from the top surface of the buffer layer 120 to the top surface of the conductive layer 192 through the height h2, instead of from the height h1 directly to the height h3. As such, by avoiding a severe height change, a failure rate in the formation of the pixel-defining layer 190 may be remarkably reduced.

Figure 7:
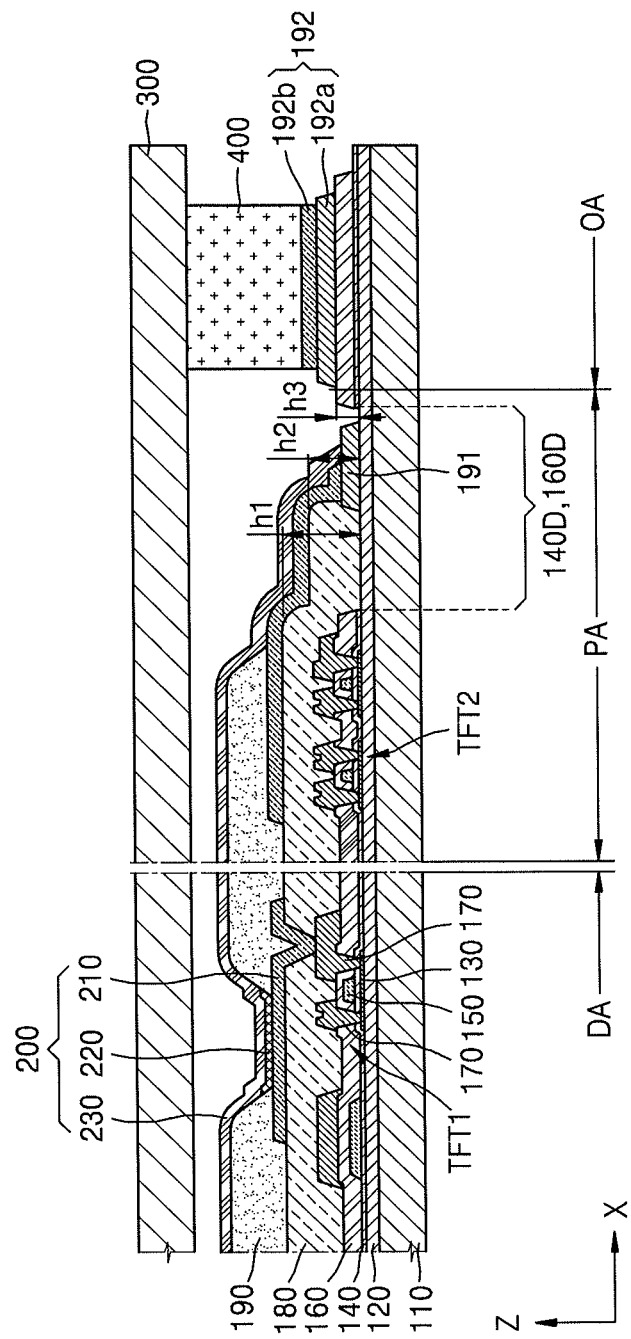
FIG. 7 illustrates a cross-sectional view of an organic light-emitting display apparatus according to another embodiment.

The conductive layer 192 may be formed of the same material as the source drain/drain electrode 170 of the thin film transistors TFT1 and TFT2 at the same time as formation of the source drain/drain electrode 170 and the electrode power supply line 191, as illustrated. In other implementations, the conductive layer 192 may be formed of the same material as the pixel electrode 210 at the same time as the formation of the pixel electrode 210. In other implementations, as illustrated in FIG. 7, the conductive layer 192 may include a first layer 192a formed of the same material as that of the source electrode/drain electrode 170 of the thin film transistors TFT1 and TFT2 at the same time as the formation of the source electrode/drain electrode 170, and a second layer 192b formed of the same material as that of the pixel electrode 210 at the same time as the formation of the pixel electrode 210. In other implementations, other conductive layers may be included.

By way of summation and review, in comparative organic light-emitting display apparatus, when a material is coated to form a pixel-defining layer, the material for forming the pixel-defining layer may not be smoothly coated.

As described above, according to the one or more of the above embodiments, the organic light-emitting display apparatus may have a structure that allows for a failure rate in the formation of an insulating layer to be reduced.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope thereof as set forth in the following claims.

What is claimed is:

1. An organic light-emitting display apparatus, comprising:
a substrate including a display area, a peripheral area surrounding the display area, and an outermost area surrounding the peripheral area;
a first insulating layer on the substrate across the display area, the peripheral area, and the outermost area, the first insulating layer being discontinuous in the peripheral area;
a buffer layer between the substrate and the first insulating layer across the display area, the peripheral area, and the outermost area;
a second insulating layer on the substrate across the display area and the peripheral area, the second insulating layer being positioned on the first insulating layer in the display area and being directly on and contacting the buffer layer in a discontinuous portion of the first insulating layer in the peripheral area; and
a pixel electrode on the second insulating layer in the display area.

2. The organic light-emitting display apparatus as claimed in claim 1, wherein the first insulating layer includes a gate insulating layer, and an interlayer insulating layer on the gate insulating layer.

3. The organic light-emitting display apparatus as claimed in claim 1, wherein, in the peripheral area, an end of the second insulating layer in a direction toward the outermost area is closer to a center portion of the substrate than an end of the discontinuous portion of the first insulating layer in the direction toward the outermost area.

4. The organic light-emitting display apparatus as claimed in claim 1, further comprising an electrode power supply line located in the peripheral area, the electrode power supply line being positioned in the discontinuous portion of the first insulating layer in the peripheral area, and an end of the second insulating layer in a direction toward the outermost area being positioned on the electrode power supply line.

5. The organic light-emitting display apparatus as claimed in claim 1, wherein the second insulating layer is stepped such that a height distance between a top surface of the buffer layer and a top surface of the second insulating layer where the second layer is positioned on the first insulating layer is greater than a height distance between the top surface of the buffer layer and the top surface of the second insulating layer in the discontinuous portion of the first insulating layer in the peripheral area.

6. The organic light-emitting display apparatus as claimed in claim 1, further comprising a sealing portion on the first insulating layer in the outermost area, the sealing portion bonding the substrate and an encapsulation substrate together.

7. The organic light-emitting display apparatus as claimed in claim 6, further comprising a conductive layer between the first insulating layer and the sealing portion in the outermost area, the first insulating layer contacting the conductive layer.

8. The organic light-emitting display apparatus as claimed in claim 7, wherein the conductive layer includes at least one of a first conductive layer and a second conductive layer, the first conductive layer being formed of a same material as a source electrode and a drain electrode in the display area, and the second conductive layer being formed of a same material as the pixel electrode in the display area.

9. An organic light-emitting display apparatus, comprising:
a substrate including a display area, a peripheral area surrounding the display area, and an outermost area surrounding the peripheral area;
a first insulating layer on the substrate across the display area, the peripheral area, and the outermost area, the first insulating layer being discontinuous in the peripheral area;

a buffer layer between the substrate and the first insulating layer across the display area, the peripheral area, and the outermost area;

a second insulating layer on the substrate across the display area and the peripheral area;

an additional insulating layer between the buffer layer and the first insulating layer; across the display area, the peripheral area, and the outermost area, the second insulating layer being positioned directly on and contacting the additional insulating layer at the discontinuous portion of the first insulating layer in the peripheral area; and a pixel electrode on the second insulating layer in the display area.

10. The organic light-emitting display apparatus as claimed in claim 9, wherein:

the additional insulating layer is a gate insulating layer, and the first insulating layer is an interlayer insulating layer.

* * * * *